United States Patent
Cheng et al.

(10) Patent No.: US 9,064,789 B2
(45) Date of Patent: Jun. 23, 2015

(54) BONDED EPITAXIAL OXIDE STRUCTURES FOR COMPOUND SEMICONDUCTOR ON SILICON SUBSTRATES

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Ali Khakifirooz, Mountain View, CA (US); Alexander Reznicek, Troy, MI (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/965,178

(22) Filed: Aug. 12, 2013

(65) Prior Publication Data
US 2015/0041853 A1  Feb. 12, 2015

(51) Int. Cl.
*H01L 21/30* (2006.01)
*H01L 21/46* (2006.01)
(Continued)

(52) U.S. Cl.
CPC ...... *H01L 29/2003* (2013.01); *H01L 21/76251* (2013.01); *H01L 29/22* (2013.01);
(Continued)

(58) Field of Classification Search
CPC ......... H01L 21/02; H01L 21/32; H01L 31/06; H01L 21/30; H01L 21/76; H01L 21/46
USPC ......... 438/479, 455–460, 406, 419, 365, 506, 438/287, 149, 748, 703; 257/507, E21.211, 257/E27.112, 617, 79, 632, E21.24, 257/E29.02, E21.219, E21.568, E21.567, 257/506, 618, E21.085, E29.068, E21.238
See application file for complete search history.

(56) References Cited

U.S. PATENT DOCUMENTS 4,891,329 A    1/1990  Reisman et al.
5,374,564 A *  12/1994 Bruel .......................... 438/455
(Continued)

OTHER PUBLICATIONS

Cheng et al., "Relaxed Silicon-Germanium on Insulator Substrate by Layer Transfer", Journal of Electronic Materials, vol. 30, No. 12, pp. 1-3 (2001).

*Primary Examiner* — Amar Movva
*Assistant Examiner* — Sheikh Maruf
(74) *Attorney, Agent, or Firm* — Louis J. Percello; Otterstedt, Ellenbogen & Kammer, LLP

(57) ABSTRACT

A structure including a compound semiconductor layer epitaxially grown on an epitaxial oxide layer is provided wherein the lattice constant of the epitaxial oxide layer may be different from the semiconductor substrate on which it is grown. Fabrication of one structure includes growing a graded semiconductor layer stack to engineer a desired lattice parameter on a semiconductor substrate or layer. The desired compound semiconductor layer is formed on the graded layer. The epitaxial oxide layer is grown on and lattice matched to the desired layer. Fabrication of an alternative structure includes growing a layer of desired compound semiconductor material directly on a germanium substrate or a germanium layer formed on a silicon substrate and growing an epitaxial oxide layer on the layer of the desired material. Following implantation of a cleavage layer and wafer bonding to a handle wafer, the layer of desired compound semiconductor material is fractured along the cleavage layer and the residual portion thereof removed. A layer of the desired compound semiconductor material is then regrown on the epitaxial oxide layer.

11 Claims, 12 Drawing Sheets

(51) Int. Cl.
   *H01L 21/76*   (2006.01)
   *H01L 29/20*   (2006.01)
   *H01L 21/762*  (2006.01)
   *H01L 29/22*   (2006.01)
   *H01L 21/02*   (2006.01)

(52) U.S. Cl.
   CPC ...... *H01L21/02381* (2013.01); *H01L 21/02433* (2013.01); *H01L 21/02463* (2013.01); *H01L 21/0251* (2013.01); *H01L 21/02546* (2013.01); *H01L 21/02565* (2013.01)

(56) References Cited

U.S. PATENT DOCUMENTS

| | | | |
|---|---|---|---|
| 5,882,987 A | 3/1999 | Srikrishnan | |
| 6,100,165 A * | 8/2000 | Sakaguchi et al. | 438/455 |
| 6,242,324 B1 | 6/2001 | Kub et al. | |
| 6,610,548 B1 | 8/2003 | Ami et al. | |
| 6,794,276 B2 * | 9/2004 | Letertre et al. | 438/506 |
| 6,852,575 B2 * | 2/2005 | Bojarczuk et al. | 438/149 |
| 7,008,857 B2 | 3/2006 | Ghyselen et al. | |
| 7,071,087 B2 | 7/2006 | Yang | |
| 7,135,699 B1 | 11/2006 | Atanackovic | |
| 7,560,361 B2 | 7/2009 | Frank et al. | |
| 7,981,768 B2 | 7/2011 | Vailant et al. | |
| 8,101,498 B2 | 1/2012 | Pinnington et al. | |
| 2005/0020032 A1 * | 1/2005 | Solanki et al. | 438/458 |
| 2005/0156246 A1 * | 7/2005 | Lochtefeld et al. | 257/347 |
| 2006/0073674 A1 * | 4/2006 | Fitzgerald et al. | 438/458 |
| 2008/0206963 A1 * | 8/2008 | Henley et al. | 438/460 |
| 2008/0315351 A1 * | 12/2008 | Kakehata | 257/507 |
| 2011/0221040 A1 * | 9/2011 | Joshi et al. | 257/618 |
| 2012/0003813 A1 * | 1/2012 | Chuang et al. | 438/458 |
| 2013/0168836 A1 * | 7/2013 | Grabbe et al. | 257/632 |
| 2013/0207226 A1 * | 8/2013 | Adam et al. | 257/507 |

* cited by examiner

BONDED EPITAXIAL OXIDE STRUCTURES FOR COMPOUND SEMICONDUCTOR ON SILICON SUBSTRATES

FIELD

The present disclosure relates to the physical sciences, and, more particularly, to semiconductor on insulator structures and methods of fabrication thereof.

BACKGROUND

Wafer bonding of some semiconductor materials to a silicon substrate can be problematic for a number of reasons. Differences in thermal expansion coefficients and lattice mismatches are among the reasons for such difficulties in wafer bonding.

One layer transfer wafer bonding process that has been employed for some applications is known as the SmartCut® process. The process involves the implantation of ions within a monocrystalline silicon wafer. The ions, typically hydrogen ions (H+), form a layer of microbubbles parallel to the wafer surface that later functions as a cleavage plane. U.S. Pat. No. 5,374,564, which is incorporated by reference herein, discloses such a process. As discussed in U.S. Pat. No. 5,882,987, also incorporated by reference herein, an oxide layer is thermally grown on the device wafer surface prior to ion implantation during the SmartCut® fabrication process. The device wafer is bonded to a silicon handle wafer, after which annealing steps are conducted. The device wafer is fractured along the hydride rich plane. The exposed surface following such fracture is polished, for example by chemical mechanical polishing (CMP), to obtain a smooth surface. U.S. Pat. No. 6,326,285, also incorporated by reference herein, discloses techniques for silicon on insulator fabrication, including hydrogen implantation, wafer bonding, and cleaving along the hydrogen layer.

Many applications benefit from the use of semiconductor materials other than silicon. Device layers comprising III-V semiconductor materials may, for example, be grown on germanium substrates. II-VI semiconductor materials are also employed in some applications as device layers. Some semiconductor materials are not available as bulk structures as their mechanical properties (e.g. weight, brittleness) do not facilitate such use.

SUMMARY

Principles of the present disclosure provide an exemplary fabrication method that includes growing a first epitaxial layer of a desired compound semiconductor material on a substrate, growing an epitaxial oxide layer on and lattice matched to the layer of the desired compound semiconductor material, and forming a cleavage plane in the layer of the desired semiconductor material via implantation, thereby forming a first structure comprising the substrate, the layer of the desired compound semiconductor material having the cleavage plane, and the epitaxial oxide layer. The method further includes bonding the first structure to a handle wafer and causing a fracture along the cleavage plane, thereby forming a second structure comprising the handle wafer, the epitaxial oxide layer, and a portion of the layer of desired compound semiconductor material. The portion of the layer of desired compound semiconductor material is removed from the second structure and a second epitaxial layer of the desired compound semiconductor material is grown on the epitaxial oxide layer.

An exemplary structure provided in accordance with the principles expressed herein includes a handle substrate, an epitaxial oxide layer, the epitaxial oxide layer being bonded directly or indirectly to the handle substrate, and a compound semiconductor layer adjoining and lattice matched to the epitaxial oxide layer.

A structure in accordance with a further embodiment includes a germanium base, one or more compound semiconductor layers adjoining the germanium base, the one or more compound semiconductor layers including a top layer of a desired compound semiconductor material, and an epitaxial oxide layer adjoining and lattice matched to the top layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Semiconductor structures and fabrication methods as disclosed herein can provide substantial beneficial technical effects. For example, one or more embodiments may provide one or more of the following advantages:
  Avoidance of ion implantation defects in a semiconductor layer;
  Relaxed compound semiconductor-on-insulator structure feasible;
  Facilitate compound semiconductor growth through use of an epitaxial oxide layer;
  Facilitate use of silicon handle wafer with a compound semiconductor layer;
  Possible reuse of donor structure;
  Enabling III-V or II-VI semiconductors on large scale wafers (e.g. 200, 300, 450 mm).

These and other features and advantages will become apparent from the following detailed description of illustrative embodiments thereof, which is to be read in connection with the accompanying drawings.

DETAILED DESCRIPTION

A III-V or II-VI compound semiconductor-on-insulator layer free of ion implantation defects is obtained in accordance with one or more exemplary embodiments through the regrowth of a semiconductor layer on an epitaxial oxide layer that retains lattice information from previous association with a layer of the same semiconductor material that comprises the regrown layer. Compound semiconductor-on-insulator structures are provided in exemplary embodiments, such as InGaAs-on-insulator, GaAs-on-insulator, ZnSe-on-insulator and InP-on-insulator, supported by a handle comprised of silicon, glass, quartz, sapphire or other suitable material.

Figure 1:
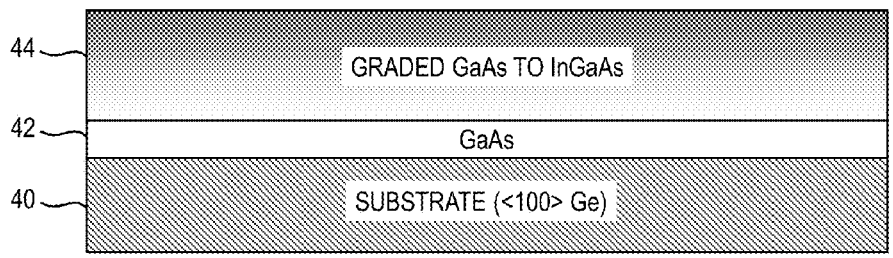
FIG. 1 is a schematic sectional view of a lattice engineered semiconductor stack grown on a semiconductor substrate.

A substrate having a desired lattice orientation is obtained, possibly miscut to a desired off-axis angle. In one exemplary embodiment, a <100> germanium substrate with miscut of about six (6) degrees is employed to avoid anti-phase domains (APD). Referring to FIG. 1, a lattice engineered semiconductor stack is epitaxially grown on the substrate 40. In one exemplary embodiment, a GaAs to InGaAs stack is grown on the substrate 40. The stack includes a GaAs layer 42 that adjoins the germanium substrate and a graded GaAs to InGaAs layer 44 adjoining the GaAs layer 42. Germanium and gallium arsenide have closely matching crystallographic properties that facilitate epitaxial growth.

Figure 2:
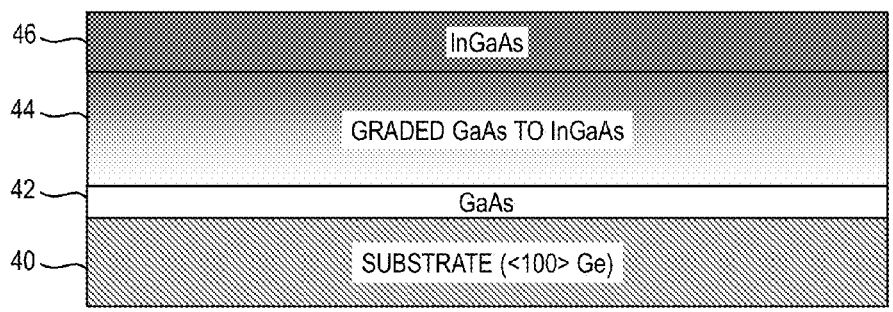
FIG. 2 is a schematic sectional view showing the growth of a layer of compound semiconductor material on the structure shown in FIG. 1.

Referring to FIG. 2, a layer 46 of semiconductor material having the composition intended for the final desired structure is grown on the stack shown in FIG. 1. In one exemplary embodiment, the semiconductor material forming layer 46 is InGaAs. The layers 42, 44, 46 can, in some embodiments, be grown in a continuous process via metalorganic chemical vapor deposition (MOCVD) using the same tool. The semiconductor layer 46 is relatively thick, for example about a half micron (0.5 μm) in one or more embodiments to reduce potential defects.

Figure 3:
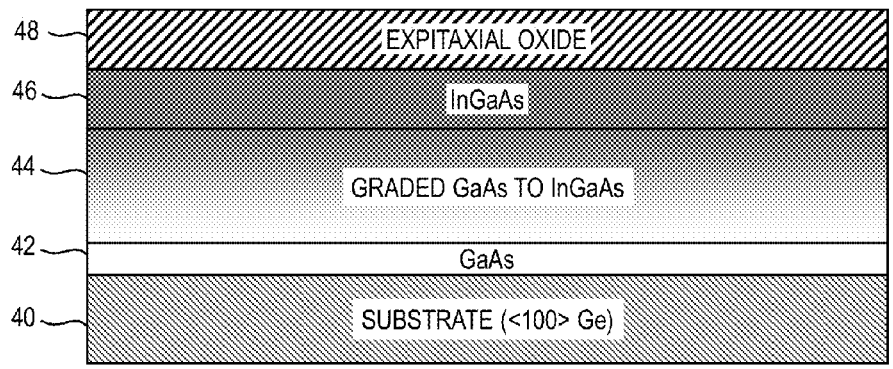
FIG. 3 is a schematic sectional view showing the growth of a lattice matched epitaxial oxide layer on the top semiconductor layer of the structure shown in FIG. 2.

A crystalline oxide layer 48 is grown epitaxially on the semiconductor layer 46 having the desired composition for the ultimately completed structure. In one exemplary embodiment, an epitaxial oxide layer 48 is grown. The oxide layer 48 is accordingly lattice matched to the underlying semiconductor layer 46. The structure shown in FIG. 3 is thereby obtained.

Exemplary epitaxial oxide materials grown on the underlying semiconductor layer 46 include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)). In some embodiments, the crystalline oxide layer 48 includes combinations of rare earth oxides (e.g., a material such as $ABO_3$, where 'A' and 'B' may be any rare earth metal (e.g., lanthanum scandium oxide ($LaScO_3$)). In yet another embodiment, the crystalline oxide layer 48 may include aluminum oxide $Al_2O_3$ or aluminum oxide compounds (e.g., lanthanum aluminum $LaAlO_3$). In yet other embodiments, the crystalline oxide layer 48 includes Perovskites (e.g. strontium titanate ($SrTiO_3$) or barium titanate ($BaTiO_3$)) which may be deposited by pulsed laser deposition (PLD). It is understood that the descriptions of crystalline oxide layers provided herein are for illustrative purposes, and that other crystalline oxide layers or layer combinations may be used in accordance with other embodiments.

For the example of an InGaAs semiconductor layer 46, InGaAs with 53% indium ($In_{0.53}Ga_{0.47}As$) is a commonly used III-V InGaAs compound as its lattice is matched to InP and can therefore easily be grown on InP. InP is typically available only as small diameter wafers having maximum four or five inch diameters. Employing similar principles as described in U.S. Pat. No. 6,852,575 with one lattice matching another one as a function of a multiple of the overlying lattice, the epitaxial oxide layer 48 could include 91.9% strontium titanate ($SrTiO_3$) with 8.1% Barium titanate ($BaTiO_3$) to lattice match 53% InGaAs. Strontium titanate is cubic and Barium titanate is tetragonal, so the compound is cubic. Three unit cells of this epitaxial oxide compound will have the same lattice constant as two unit cells of the 53% InGaAs.

A further exemplary embodiment includes a II-VI semiconductor layer, namely ZnSe, as grown by a MBE (molecular beam epitaxy) process as described in U.S. Pat. No. 7,071,087. The '087 patent is incorporated by reference herein. ZnSe has a lattice constant close to germanium and accordingly can be grown directly on germanium. Growing a relatively thick (e.g. 100-500 nm) ZnSe layer will relax the ZnSe to its natural unstrained lattice parameters. A lathanium/yttrium compound epitaxial oxide is formed on the semiconductor layer using methodology familiar to those of skill in the art. The epitaxial oxide in one exemplary embodiment includes 95% $La_2O_3$ and 5% $Y_2O_3$ for matching at two times the lattice constant of ZnSe. MBE can be employed for forming the oxide layer on ZnSe. U.S. Pat. No. 6,852,575, which is incorporated by reference herewith, discusses the linear interpolation of $La_2O_3$ and $Y_2O_3$ and an alloy created therefrom.

Figure 4:
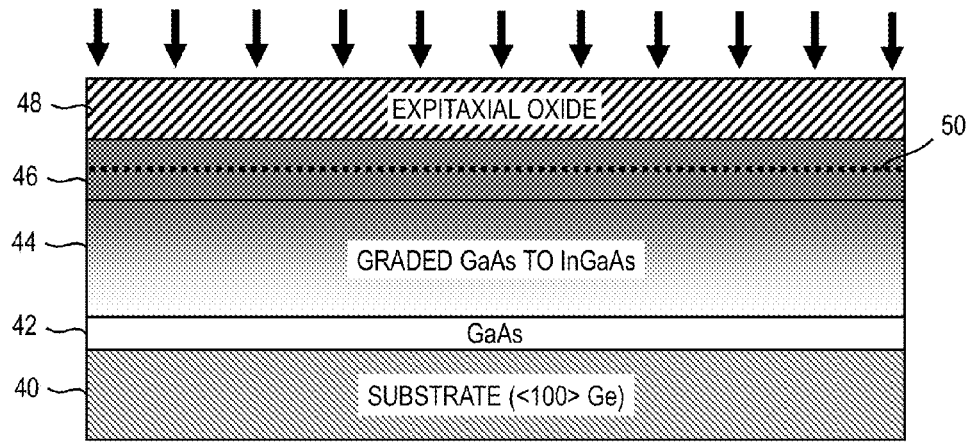
FIG. 4 is a schematic sectional view showing the implantation of hydrogen into the top semiconductor layer.

Referring to FIGS. 4-7, a process similar to the SmartCut® process discussed above using hydrogen implantation is conducted, though within a III-V or II-VI material in one or more exemplary embodiments rather than silicon. A hydrogen layer 50 is formed in the top semiconductor layer 46 via ion implantation through the epitaxial oxide layer 48, as shown in FIG. 4. The hydrogen layer 50 is generally parallel to the top surface of the semiconductor layer 46. The semiconductor layer has sufficient thickness to allow the hydrogen layer 50 to be formed between the top and bottom surfaces thereof. In one or more alternative embodiments, inert gas ions are implanted within the semiconductor layer 46 rather than hydrogen. The SmartCut® process does not work as well on all types of semiconductor materials as it does with respect to <100> silicon. With respect to III-V materials formed on miscut substrates, the cutting of the III-V material will not be along an ideal path. Moreover, the electrical properties of III-V materials can be effectively destroyed by hydrogen implantation by forming electrically active states. The processes described herein allow the use of ion implantation with respect to III-V and other compound semiconductor materials despite such inherent problems.

Figure 5:
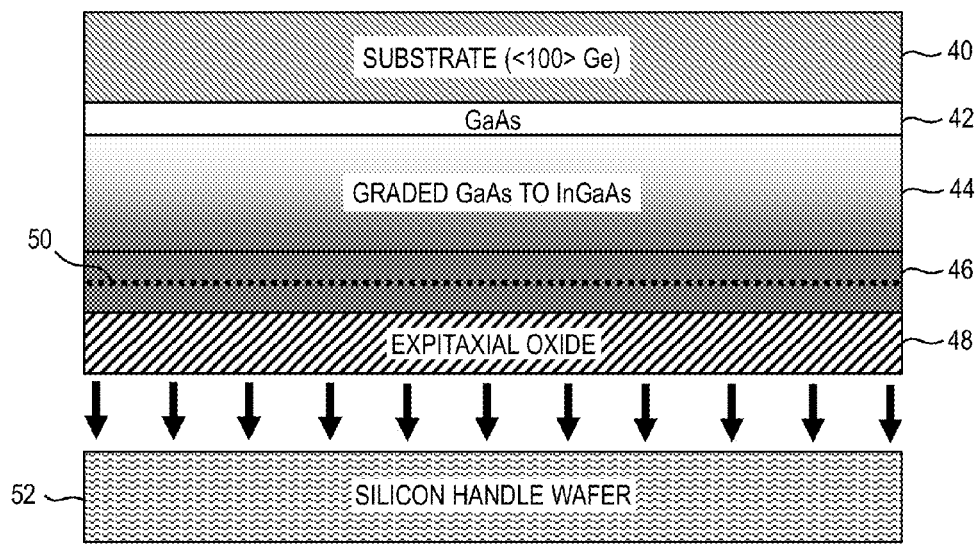
FIG. 5 is a schematic sectional view showing the wafer bonding of the structure to a silicon handle layer.
Figure 6:
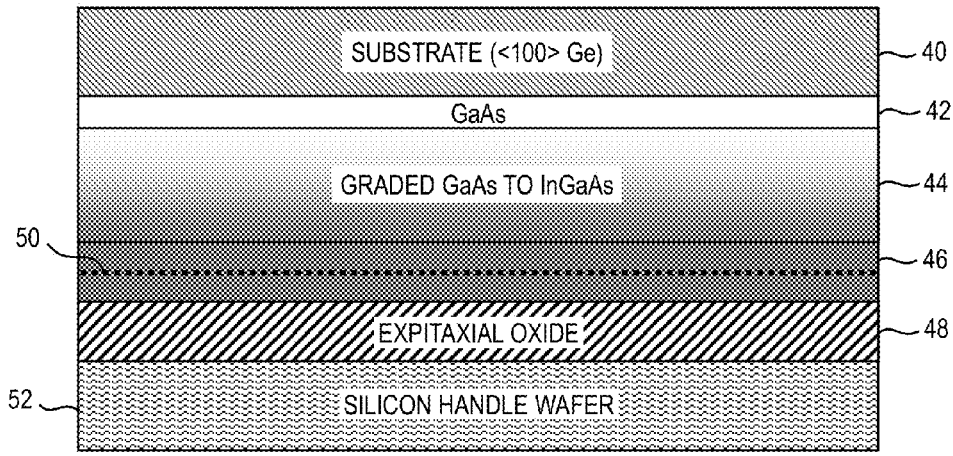
FIG. 6 is a schematic sectional view showing the structure obtained following wafer bonding.

Referring to FIGS. 5 and 6, a silicon handle wafer 52, which is bulk silicon with an optional thermal oxide layer in one or more embodiments, is positioned in opposing relation to the exposed surface of the epitaxial oxide layer 48. Conventional wafer bonding techniques familiar to those of skill in the art are employed to bond the handle wafer 52 to the epitaxial oxide layer 48. U.S. Pat. No. 7,560,361, which is incorporated by reference herein, discloses applicable wafer bonding procedures. The structure shown schematically in FIG. 6 is thereby obtained. The handle wafer 52 may optionally include a thermal oxide layer or a dielectric surface layer (not shown), either of which may be silicon dioxide ($SiO_2$) in the case of a silicon handle wafer, that bonds with the epitaxial oxide layer.

Figure 7:
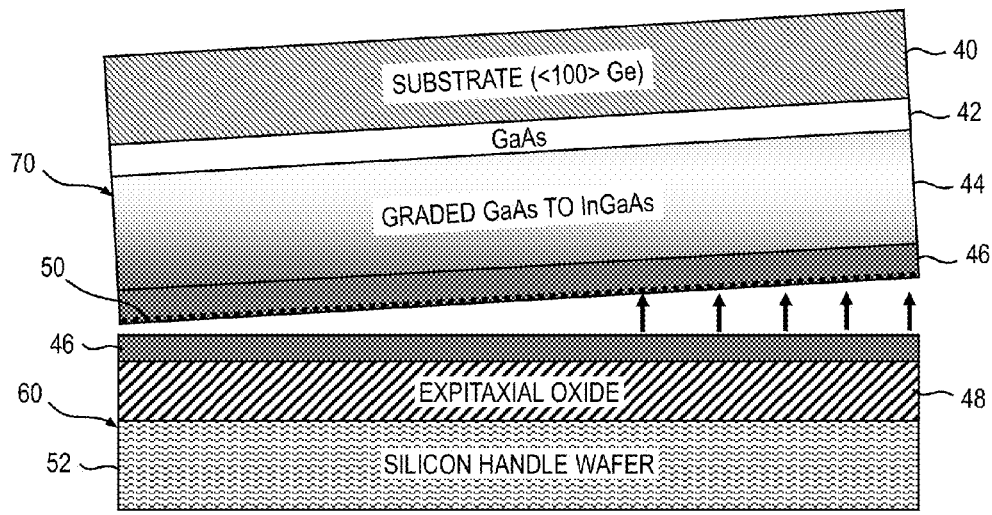
FIG. 7 is a schematic sectional view showing cleavage of the semiconductor layer along the layer of implanted hydrogen.
Figure 8:
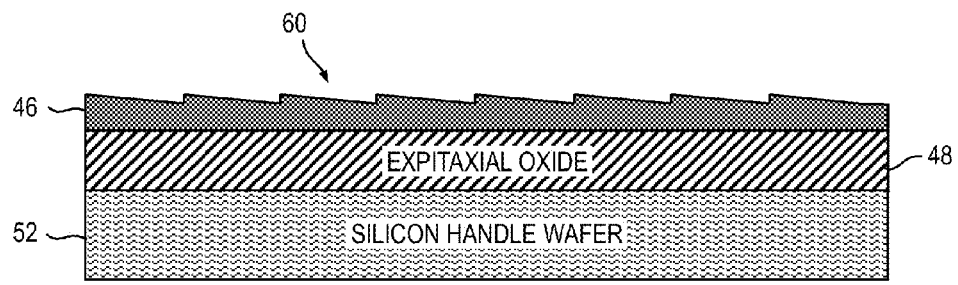
FIG. 8 is a schematic sectional view showing the structure following cleavage of the semiconductor layer.

Referring to FIG. 7, the structure is fractured along the cleavage plane defined by the hydrogen layer 50 or any alternative implanted ion layer that may be provided using techniques familiar to those of skill in the art. For example, as further discussed in U.S. Pat. No. 7,560,361, fracturing along an implant region in a semiconductor layer can be accomplished by annealing the structure that includes the semiconductor layer at an appropriate temperature following the step of wafer bonding. The annealing may be supplemented by the application of a mechanical force to fracture the structure along the implanted cleavage plane. First and second structures 60, 70 are thereby obtained. The first structure 60, which is employed in fabricating the ultimately desired structure, includes the silicon handle wafer 52, the epitaxial oxide layer 48, and a residual portion of the semiconductor layer 46, as shown in FIG. 8. The residual semiconductor layer 46 of the structure 60 is shown as including a rough, defective surface. The second structure includes the original substrate 40, the lattice engineered semiconductor stack, and a residual portion of the semiconductor layer 46. As discussed hereafter, the second structure 70 can be reused.

Figure 9:
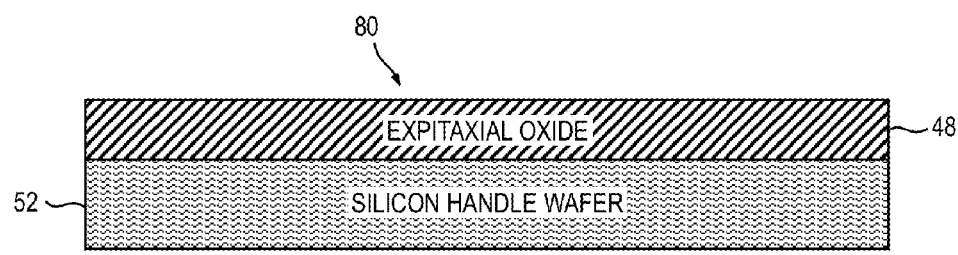
FIG. 9 is a schematic sectional view showing removal of the compound semiconductor layer from the epitaxial oxide layer of the structure shown in FIG. 8.

Referring to FIG. 9, the defective residual layer 46 of semiconductor material is removed by, for example, selective etching, RIE (reactive ion etching) or CMP (chemical mechanical polishing). The type of etch depends on the III-V or II-VI semiconductor material employed. For InGaAs, a wet etch process employing a citric Acid/$H_2O_2$ mixture that selectively etches InGaAs is an option. For dry etching (RIE), a $SiCl_4$/$SiF_4$/HBr based selective dry etch may be employed.

Having been grown epitaxially on the semiconductor layer 46 prior to ion implantation and being lattice matched thereto, as discussed above, the epitaxial oxide layer 48 retains the lattice information of the semiconductor layer 46 following its removal. The structure 80 includes the silicon handle 52 and the epitaxial oxide layer 48 once the semiconductor layer 46 has been removed.

Figure 10:
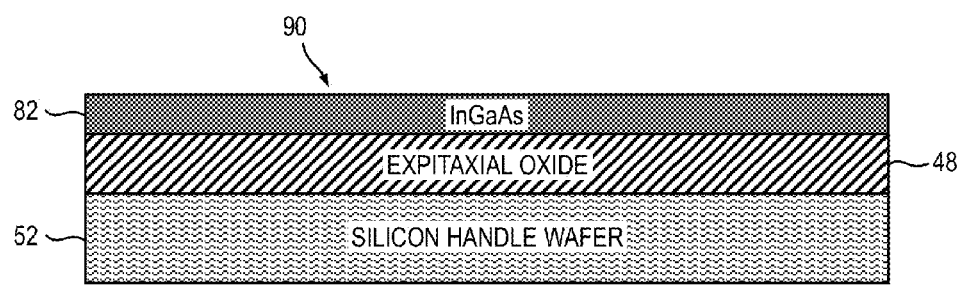
FIG. 10 is a schematic sectional view showing regrowth of the compound semiconductor layer on the epitaxial oxide layer of the structure.

A semiconductor layer 82 having substantially the same composition as the originally deposited semiconductor layer 46 is grown on the exposed surface of the oxide layer 48 of the structure 80. The new semiconductor layer 82, not having been subject to ion implantation, is free of defects that would result from such processing. A relaxed compound semiconductor-on-insulator structure 90 is formed in one or more embodiments, as shown in FIG. 10. Exemplary embodiments of the structure 90 include 300 mm InGaAs-on-insulator, GaAs-on-insulator and InP-on-insulator wafers. Other compound-on-insulator structures are obtainable, as those of skill in the art will appreciate. II-VI semiconductor layers can be employed in the fabrication of alternative structures, for example ZnSe-on-insulator structures, using techniques similar to those described herein. (See FIGS. 24-27 and discussion below.) The specific examples provided herein are accordingly to be considered exemplary as opposed to limiting.

Figure 11:
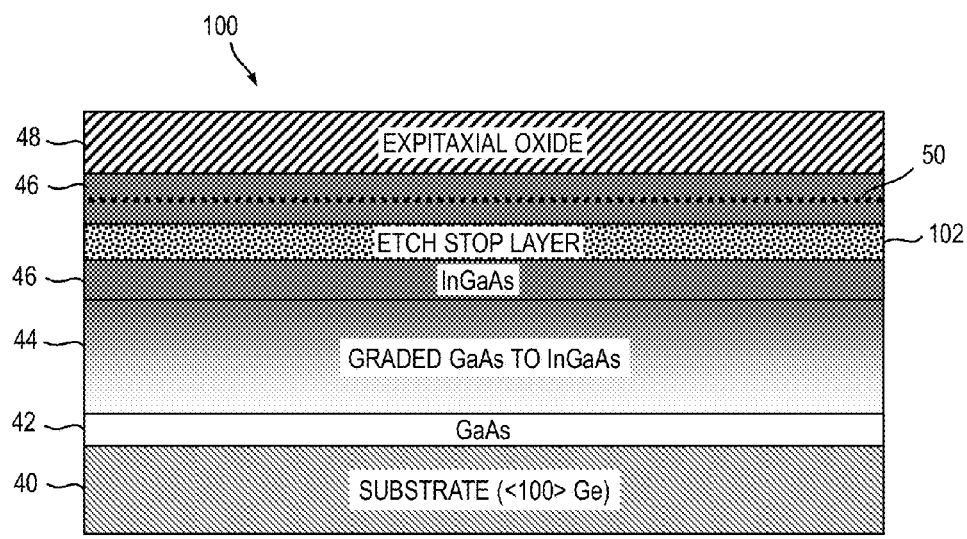
FIG. 11 is a schematic sectional view showing an alternative embodiment of the structure shown in FIG. 4 that includes an etch stop layer.

FIG. 11 shows an exemplary embodiment of a structure 100 including an etch stop layer 102 buried within the semiconductor layer 46. The structure 100 is otherwise the same as that shown in FIG. 4 following ion implantation within the semiconductor layer 46. The etch stop layer 102 has the same composition as the epitaxial oxide layer 48 in some embodiments. An etch stop layer can possibly be formed by growing a doped layer in some embodiments. The choice of the etch stop layer depends on the III-V or II-VI material chosen. For InGaAs, InP could act as etch stop layer, since it has the same lattice constant as 53% InGaAs but different chemical properties. For embodiments employing ZnSe, as discussed further below, a buried Ge layer in the relaxed ZnSe could be employed as an etch stop layer.

Figure 12:
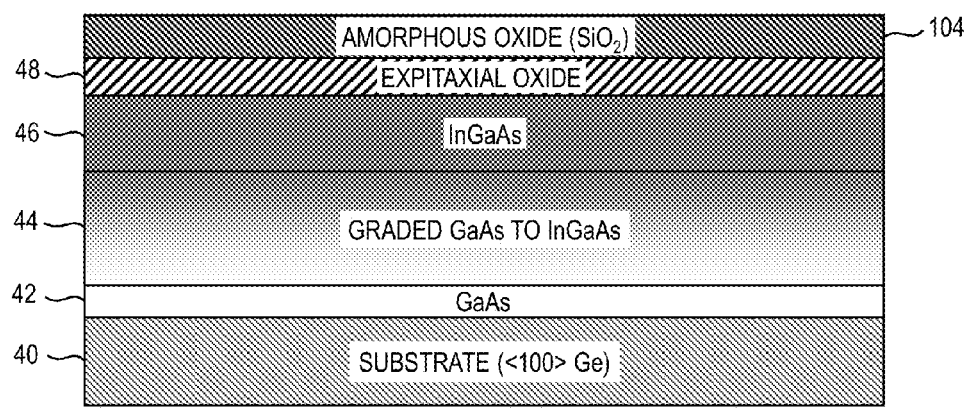
FIG. 12 is a schematic sectional view showing an alternative embodiment wherein a silicon oxide layer is provided on the structure shown in FIG. 3.
Figure 13:
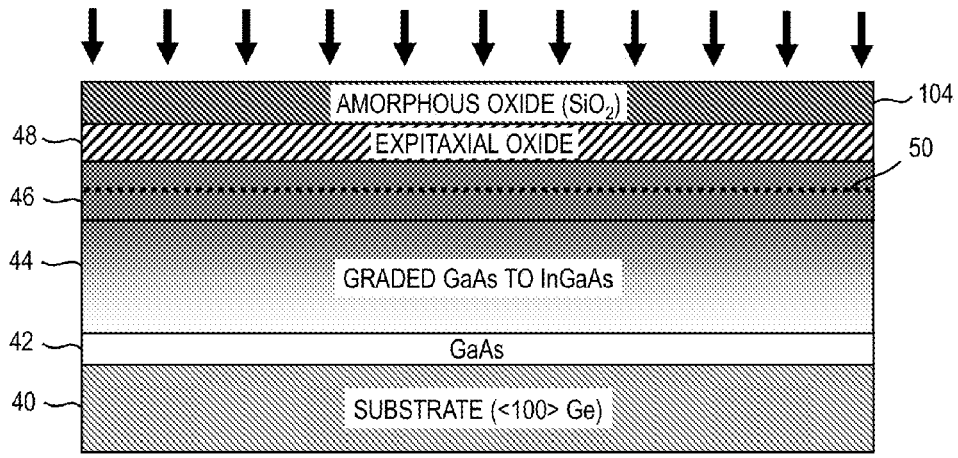
FIG. 13 is a schematic sectional view showing the implantation of hydrogen into the top semiconductor layer of the structure shown in FIG. 12.

FIGS. 12-19 show steps of an exemplary process that includes the formation of an amorphous oxide layer on an epitaxial oxide layer. The same reference numerals are employed to designate elements also found in the structures shown in FIGS. 1-11. Referring to FIG. 12, an amorphous oxide layer 104 such as silicon oxide is deposited on the exposed surface of the epitaxial oxide layer 48 of the structure shown in FIG. 3. This process is well known in art and includes, for example, LPCVD oxide deposition, with optional densification anneal. Other oxide deposition processes would also be feasible. Silicon oxide is preferred in one or more embodiments, but other oxides or nitrides would be acceptable if optimized. A hydrogen layer 50 or layer of inert gas ions is implanted within the semiconductor layer 46 and through the oxide layers 48, 102 forming a cleavage plane, as shown in FIG. 13.

Figure 14:
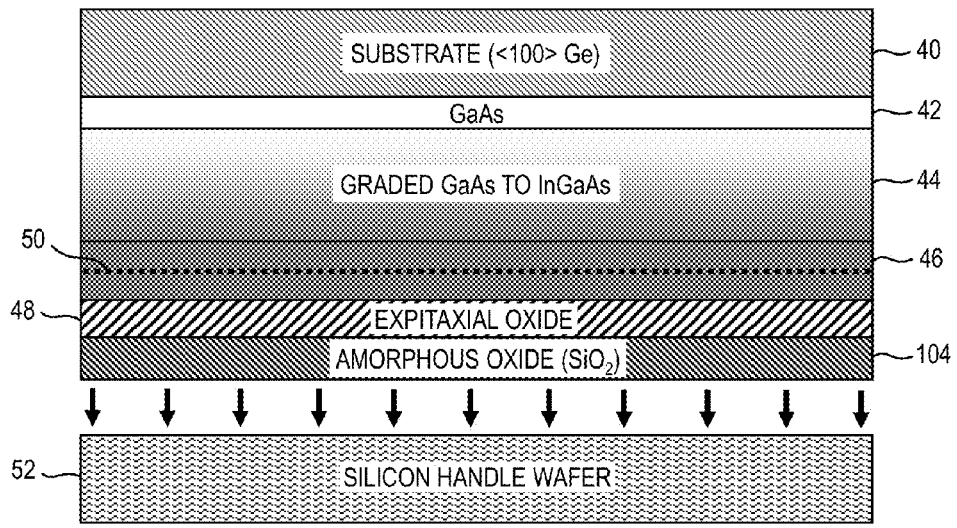
FIG. 14 is a schematic sectional view showing the wafer bonding of the structure shown in FIG. 13 to a silicon handle layer.

Referring to FIG. 14, the structure obtained following deposition of the silicon oxide layer is positioned in opposing relation to a silicon handle wafer 52. The structure is wafer bonded to the handle wafer such that the silicon oxide layer 104 is bonded to the handle wafer. As discussed above, the handle wafer may itself include a surface oxide layer (not shown), in which case the silicon oxide layer 104 would bond to the silicon oxide surface layer on the handle wafer. Techniques for wafer bonding of silicon oxide to silicon are well known to those of skill in the art. The use of a silicon oxide layer on the epitaxial oxide layer allows the use of such conventional techniques.

Figure 15:
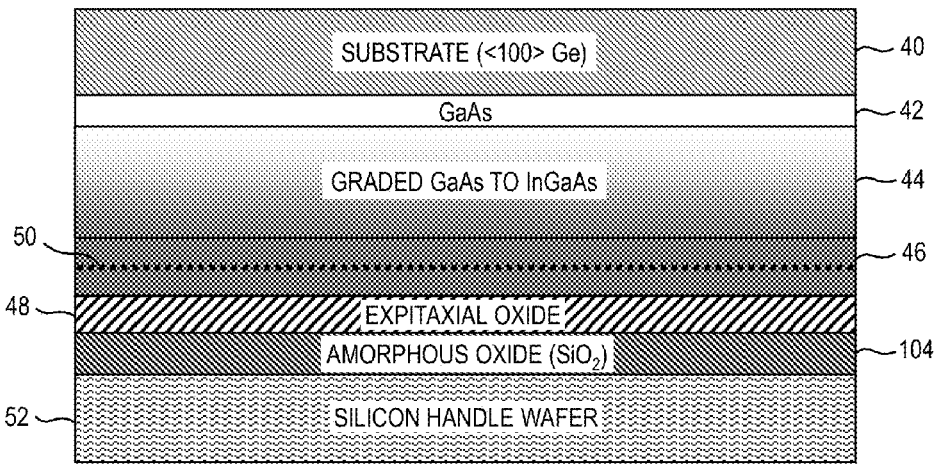
FIG. 15 is a schematic sectional view showing the structure following the step of wafer bonding.
Figure 16:
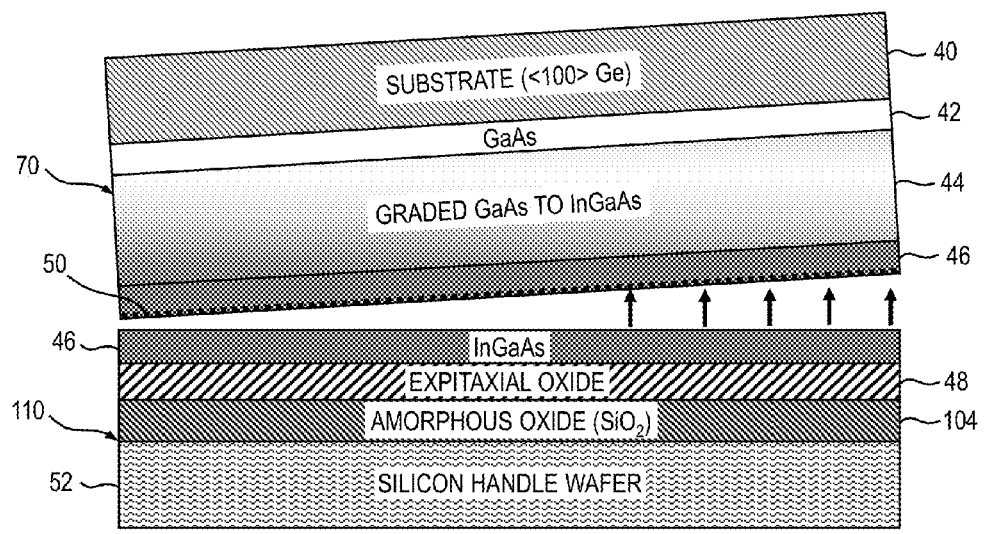
FIG. 16 is a schematic sectional view showing cleavage of the semiconductor layer along the layer of implanted hydrogen shown in FIG. 15.
Figure 17:
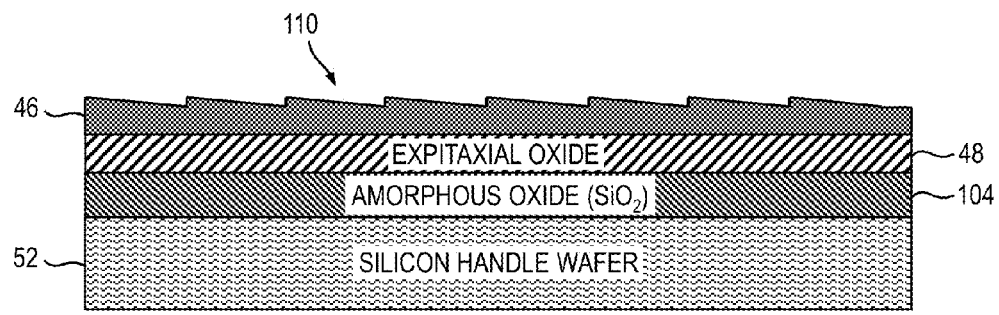
FIG. 17 is a schematic sectional view showing the structure following cleavage of the top semiconductor layer along the layer of implanted hydrogen.

A fracture is created within the semiconductor layer 46 along the cleavage plane formed by the hydrogen layer 50 in one or more exemplary embodiments, splitting the structure shown in FIG. 15 into a first structure 110 and a second structure 70 as shown in FIG. 16. The first structure 110 includes the silicon handle layer, the oxide layer 104 bonded to the handle layer, the epitaxial oxide layer, and a residual portion of the compound semiconductor layer 46 on which the epitaxial oxide layer 48 was formed. The first structure 110 is shown in FIG. 17 with the rough, defective surface of the semiconductor layer portion schematically illustrated. The second structure 70 can be reused.

Figure 18:
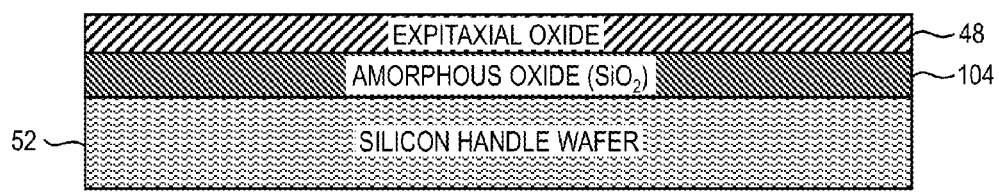
FIG. 18 is a schematic sectional view showing removal of the residual top semiconductor layer from the structure shown in FIG. 17.
Figure 19:
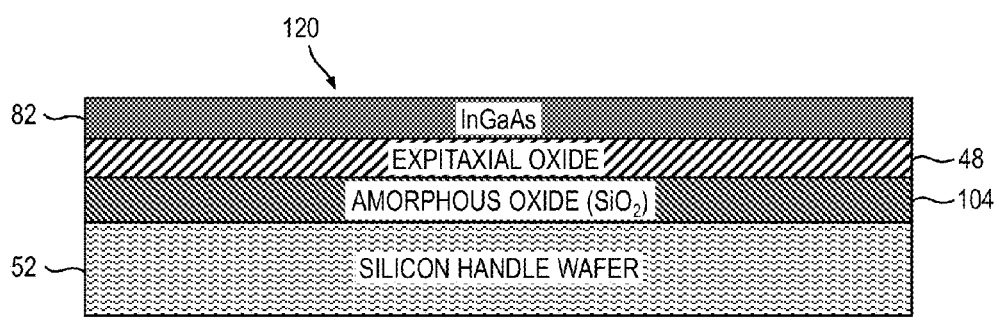
FIG. 19 is a schematic sectional view showing regrowth of the top semiconductor layer from the structure shown in FIG. 18.

The rough, defective portion of the semiconductor layer remaining on the first structure 110 is removed as shown in FIG. 18. A semiconductor layer 82 having substantially the same composition as the originally deposited semiconductor layer 46 is epitaxially grown on the exposed surface of the lattice matched oxide layer 48 of the structure 120 as shown in FIG. 19. As described above with respect to the structure shown in FIG. 10, a substantially perfect, relaxed compound semiconductor-on-insulator structure is provided.

Figure 20:
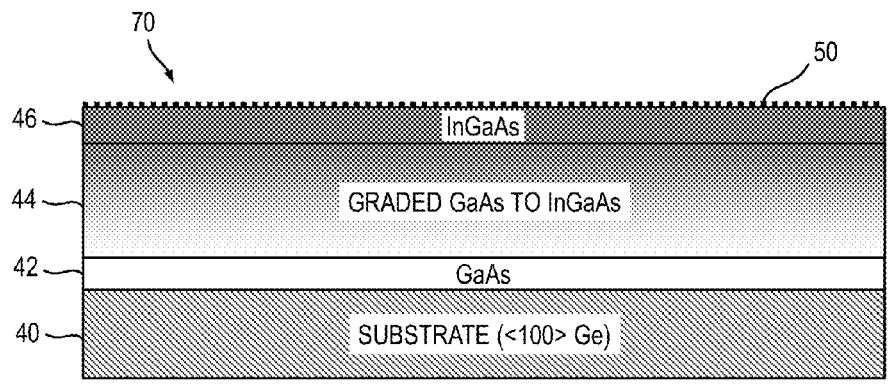
FIG. 20 is a schematic sectional view showing the donor wafer following cleavage along the layer of implanted hydrogen.
Figure 21:
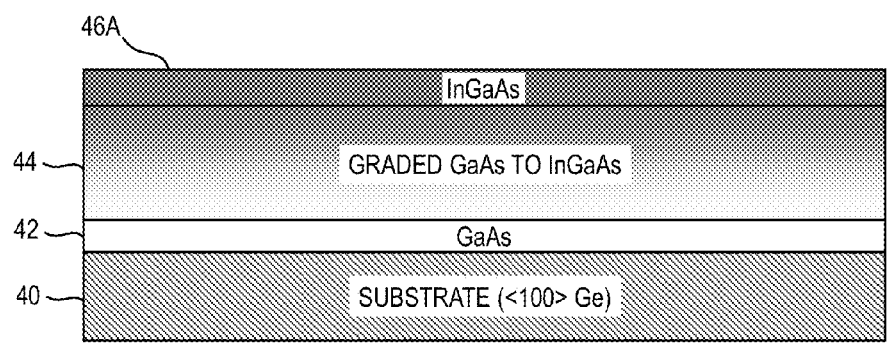
FIG. 21 is a schematic sectional view showing the donor wafer depicted in FIG. 20 following chemical mechanical polishing of the top semiconductor layer.

The processes disclosed herein facilitate reuse of the original substrate 40 and the lattice engineered semiconductor stack formed thereon. FIG. 20 shows one of the structures obtained following separation of the first structure 60 from the second structure 70 along the cleavage plane defined by the exemplary implanted hydrogen layer 50. Such separation is shown in FIG. 7. The structure 70 is subjected to touch-up chemical mechanical planarization (CMP) to obtain the structure shown in FIG. 21. A portion 46A of the residual semiconductor layer 46 remains on the semiconductor stack in some embodiments. The lattice of the planarized semiconductor layer 46A is sufficiently defect-free for growing the new semiconductor layer 46B on which the epitaxial oxide layer is later formed. Growing the III-V or II-VI semiconductor material thick traps possible defects at the lower interface and the top portion is defect free.

Figure 22:
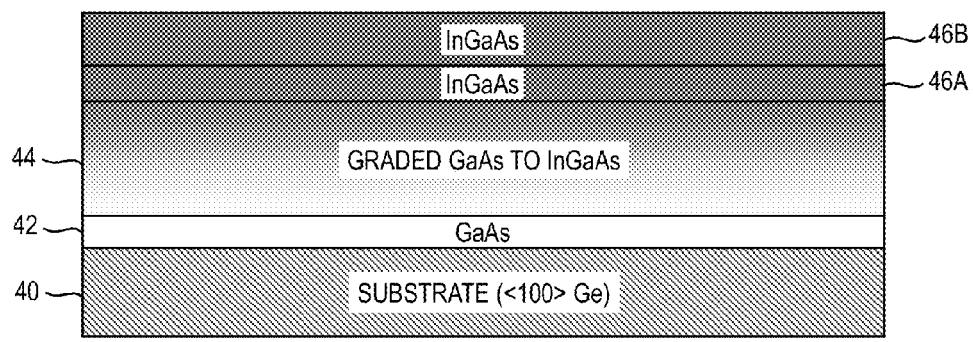
FIG. 22 is a schematic sectional view showing regrowth of the top semiconductor layer on the structure shown in FIG. 21.

As shown in FIG. 22, a semiconductor layer 46B having substantially or exactly the same composition as the originally formed semiconductor layer 46 is grown on the structure. The thickness of the semiconductor layer 46B should be sufficient such that it is substantially free of defects at the top surface. A semiconductor layer thickness of about half a micron (0.5µ) is provided in one or more embodiments.

Figure 23:
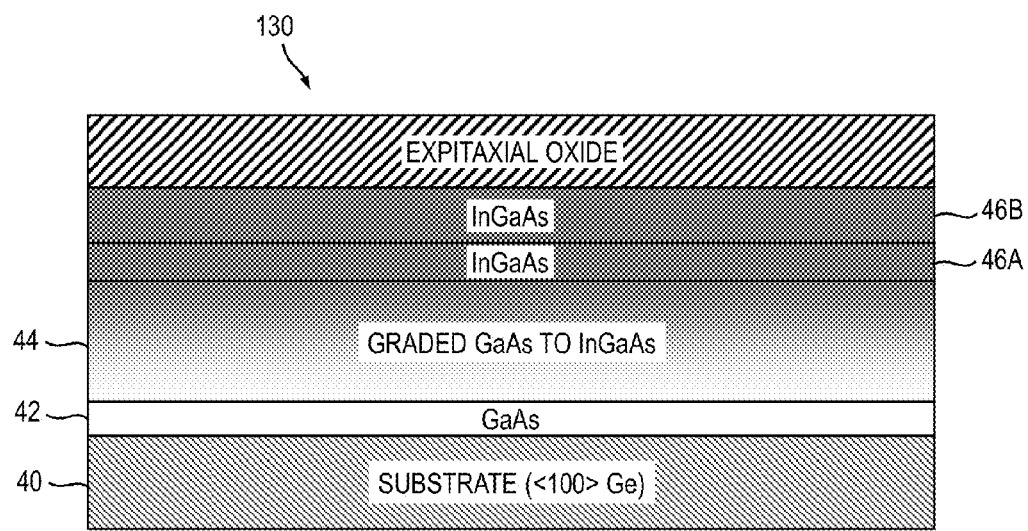
FIG. 23 is a schematic sectional view showing regrowth of an epitaxial oxide layer on the top semiconductor layer of the structure shown in FIG. 22.

An oxide layer 48 is grown epitaxially on the surface of the semiconductor layer 46B, forming the structure 130 shown in FIG. 23. The structure 130 can be further processed as described above with respect to FIGS. 4-10 to form a relaxed compound semiconductor-on-insulator structure. Standard size wafers (e.g. 300 mm) having, for example, III-V material-on-insulator or II-VI material-on-insulator structures can be fabricated using the techniques described herein.

As discussed above, the handle wafer 52 in some embodiments is a silicon wafer. Structures including silicon wafers are suitable for many types of electronic devices. Glass, quartz, or sapphire handle wafers may be employed in other embodiments where greater transparency is desired. Light emitting diodes and solar cells are among the applications that could benefit from a substantially transparent handle layer.

Figure 24:
FIGS. 24-27 illustrate exemplary schematic steps for fabricating a compound semiconductor on a silicon substrate that involve growing epitaxial Ge/SiGe on a silicon substrate.
Figure 25:
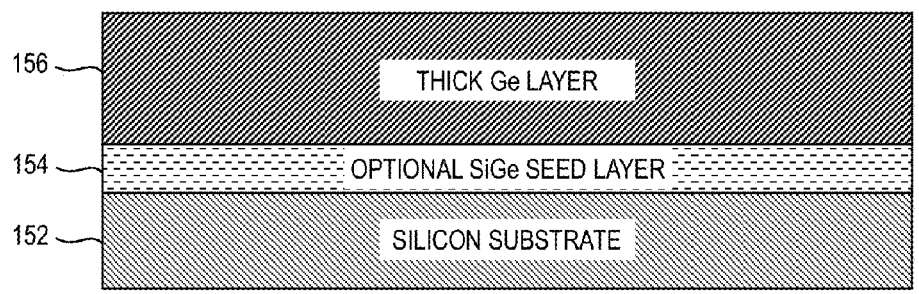

Referring to FIGS. 24-27, exemplary steps for forming a structure including a ZnSe semiconductor layer are illustrated. A silicon substrate 152 is obtained, as shown in FIG. 24. The substrate can be in the form of a 200 mm or 300 mm wafer in one or more embodiments. A thick (e.g. 1-2 µm) germanium layer 156 is grown on the substrate 152. An optional SiGe seed layer 154, as shown in FIG. 25, may first be grown on the substrate 152 to facilitate growth of the germanium layer 156. The seed layer, if employed, contains a high percentage (e.g. 30-80%, more preferably 40-60% germanium) of germanium. The thickness of the seed layer is between 5-50 nm in one or more embodiments. The process is familiar to those of skill in the art. U.S. Pat. No. 7,071,087 discloses an exemplary process for forming a germanium layer on an off-cut silicon substrate using SiGe seed layer(s) having higher germanium content. While seed layer(s) having such higher germanium content may alternatively be employed to form the seed layer(s) 154, better initial seed layer growth and lower incubation times are observed by using SiGe having the germanium content in the preferred (40-60%) range.

Figure 26:
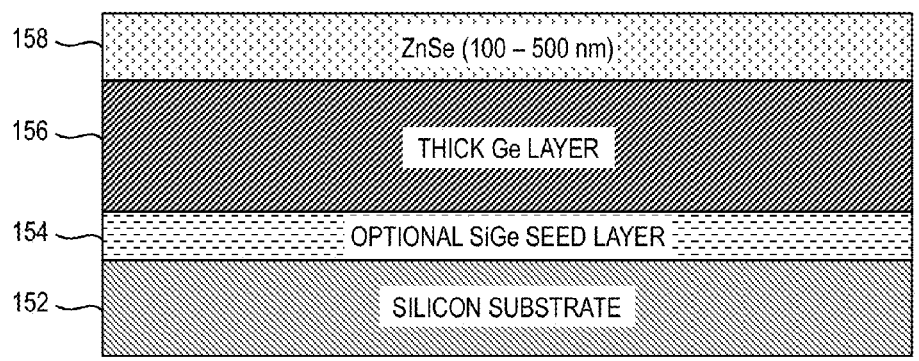

As shown in FIG. 26, a layer 158 of desired semiconductor material such as a Group II-VI or Group III-V material is grown on the thick germanium layer 156. In the illustrative embodiment, a II-VI material, namely zinc selenide (ZnSe) is grown on the germanium layer. Growth of a ZnSe layer on germanium is known to the art. An exemplary technique is disclosed in U.S. Pat. No. 7,071,087, which is incorporated by reference herein. The ZnSe layer has a thickness of 100-500 nm in one or more embodiments. An epitaxial oxide layer 160 is grown on the ZnSe layer 158 to obtain the structure 150 shown in FIG. 27. Growth of an epitaxial oxide layer on ZnSe using MBE is discussed above. In this embodiment, the lattice grading (relaxation) and defect trapping at the bottom of the semiconductor layer 158 will take place in the germanium layer 156. The structure 150 is subjected to ion implantation through the epitaxial oxide layer to form a cleavage plane in the semiconductor layer 158. FIG. 4 and the related discussion in the patent specification describe such a procedure. Process steps described above with respect to FIGS. 5-10 are performed to obtain a structure as shown in FIG. 10 with a ZnSe semiconductor layer as opposed to the InGaAs layer semiconductor layer shown therein. Optionally, a silicon oxide layer (not shown) may be formed on the epitaxial oxide layer 160 to facilitate wafer bonding as discussed above with respect to FIGS. 12-15.

Figure 28:
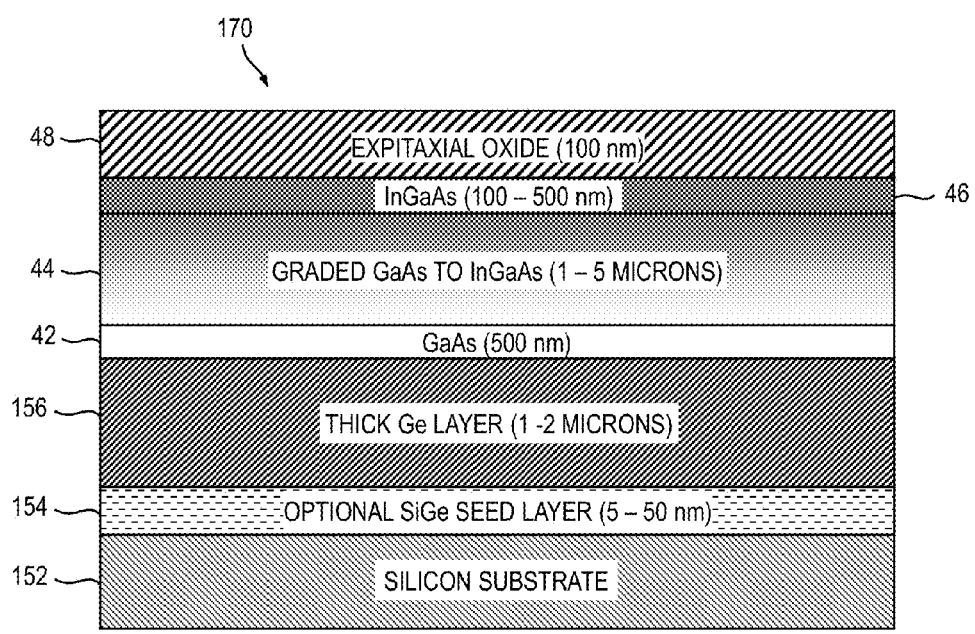
FIG. 28 is a schematic sectional view illustrating an alternative structure obtained using the structure shown in FIG. 25.

While the embodiments shown in FIGS. 1-7, 11, and 12-16 employ a germanium substrate 40, a thick germanium layer 156 formed on a silicon substrate as described above with respect to FIGS. 24 and 25 may alternatively be used to fabricate a structure 90 such as shown in FIG. 10. The use of a silicon structure in this manner facilitates 200-300 mm wafer application to the process. The silicon substrate is off-cut six degrees in some embodiments. A structure 170 as shown in FIG. 28 would accordingly be obtained by forming the GaAs layer 42, the graded layer 44, the InGaAs layer 46 and the epitaxial oxide layer 48 on the germanium layer 156. Exemplary thickness ranges for the various layers are provided in FIG. 28. As indicated, the GaAs layer may be about 500 nm in thickness and the graded layer 44 between 1-5 µm. The InGaAs layer in the exemplary embodiment is between 100-500 nm in thickness and the epitaxial oxide layer is about 100 nm. Further processing such as ion implantation within the InGaAs layer, wafer bonding, fracturing along a cleavage plane, etc. would be performed using the structure 170 in the same manner described above with respect to FIGS. 4-10.

Given the discussion thus far, an exemplary fabrication method includes growing a lattice engineered semiconductor stack 42, 44 on a substrate 40, growing a first epitaxial layer 46 of a desired semiconductor material on a top surface of the stack, growing an epitaxial oxide layer 48 on the desired semiconductor material, and forming a cleavage plane in the desired semiconductor layer via implantation, thereby forming a first structure comprising the substrate, the lattice engineered semiconductor stack, the layer of desired semiconductor material including the cleavage plane, and the epitaxial oxide layer. An exemplary first structure is shown in FIG. 4. The method further includes bonding the first structure to a handle wafer 52 and causing a fracture along the cleavage plane, thereby forming a second structure comprising the handle wafer, the epitaxial oxide layer, and a portion of the layer of desired semiconductor material. An exemplary second structure is shown in FIG. 8. The residual portion of the layer of desired semiconductor material is removed from the second structure. A second epitaxial layer 82 of the desired semiconductor material is grown on the epitaxial oxide layer. The exemplary structures 90, 120 shown in FIGS. 10 and 19, respectively, can be obtained through such a fabrication method. The desired semiconductor layer comprises group III-V materials in some embodiments and group II-VI materials in other embodiments. The lattice engineered semiconductor stack comprises a graded layer of group III-V compounds in embodiments where the desired semiconductor layer is comprised of a group III-V material such as InGaAs. The fabrication method includes forming an oxide layer such as silicon oxide on the epitaxial oxide layer in some embodiments wherein the step of bonding the first structure to the handle wafer 52 further includes bonding the oxide layer 104 to the handle wafer 52, such as shown in FIG. 15. As discussed above, the structure 70 including the substrate 40 can optionally be reused. The fabrication method may further include obtaining a third structure 70 comprising the substrate, the lattice engineered semiconductor stack, and a residual layer of the desired semiconductor material obtained from the fracture along the cleavage plane, planarizing a surface of the residual layer, growing a further layer 46B comprising the desired semiconductor material on the planarized surface of the residual layer 46A, and growing a further epitaxial oxide layer on the further layer comprising the desired semiconductor material. The exemplary structure 130 shown in FIG. 23 can be produced in this manner. One or more embodiments of the method further includes of forming an etch stop layer within the first epitaxial layer of the desired semiconductor material as shown in FIG. 11. The cleavage plane comprises hydrogen in one or more embodiments and is implanted above the etch stop layer in embodiments where an etch stop layer is employed.

A further exemplary method includes growing a first epitaxial layer of a desired compound semiconductor material on a substrate. FIGS. 2 and 28 show an epitaxial layer 46 wherein the desired compound semiconductor material is InGaAs grown on a graded layer 44 on a germanium substrate. In an alternative embodiment, the desired compound semiconductor material is ZnSe grown directly on the germanium layer 156 on a silicon substrate 152 as shown in FIG. 26. An epitaxial oxide layer (48 in FIGS. 3 and 28, 160 in FIG. 27) is grown on and lattice matched to the layer of the desired compound semiconductor material. A cleavage plane is formed in the layer of the desired semiconductor material via implantation, thereby forming a first structure comprising the substrate, the layer of the desired compound semiconductor material having the formed cleavage plane, and the epitaxial oxide layer. FIGS. 4 and 13 illustrate exemplary first structures. Once subjected to ion implantation, the embodiments of FIGS. 27 and 28 would also form first structures. The first structure is bonded to a handle wafer 52. The method further includes causing a fracture along the cleavage plane, thereby forming a second structure comprising the handle wafer, the epitaxial oxide layer, and a portion of the layer of desired compound semiconductor material. Exemplary second structures are shown in FIGS. 8 and 17. The portion of the layer of desired compound semiconductor material is removed from the second structure and a second epitaxial layer of the desired compound semiconductor material is grown on the epitaxial oxide layer. FIGS. 18-19 respectively show removal of the residual portion of the desired semiconductor material and growth of a second epitaxial layer 82 of the desired compound semiconductor material.

Figure 27:
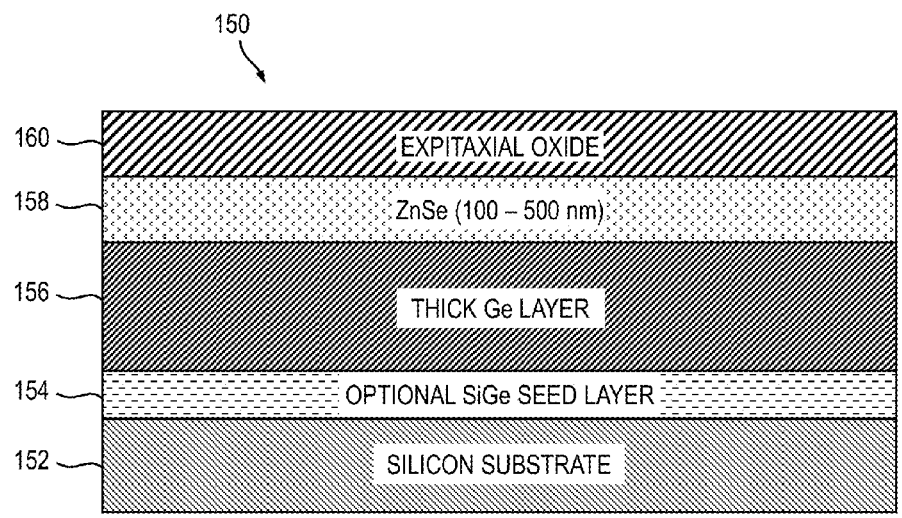

An exemplary structure provided in accordance with the disclosed embodiments includes a crystalline semiconductor substrate 40, a lattice engineered semiconductor stack 42,44 on the substrate, the semiconductor stack having a first region 42 adjoining the substrate and substantially lattice matched to the substrate and a second region not lattice matched to the substrate and defining a top surface of the semiconductor stack. A compound semiconductor layer adjoins and is substantially lattice matched to the top surface of the semiconductor stack. In some embodiments, a compound semiconductor layer such as a ZnSe layer 158 is grown directly on a thick germanium layer 156 rather than a graded compound semiconductor layer 44. An epitaxial oxide layer 48 adjoins the compound semiconductor layer 46. FIG. 3 shows such one exemplary structure. FIG. 27 shows an alternative structure 150 including an epitaxial oxide layer 160 adjoining a compound semiconductor layer 158. The structure further includes an implanted cleavage plane layer within the compound semiconductor layer, which in some embodiments comprises an implanted hydrogen layer 50. One or more embodiments of the structure further include a silicon oxide layer 104 on the epitaxial oxide layer 48 such as shown in FIG. 13. The compound semiconductor layer is comprised of a group III-V material in one or more embodiments and a group II-VI material in alternative embodiments. The exemplary structure may further include a handle wafer which is, in some embodiments, bonded to the silicon oxide layer 104.

A further exemplary structure includes or consists of a handle substrate, an epitaxial oxide layer, the epitaxial oxide layer 48 being bonded directly or indirectly to the handle substrate, and a compound semiconductor layer adjoining the epitaxial oxide layer and lattice matched to the epitaxial oxide layer. In some embodiments such as shown in FIG. 19, an oxide layer 104 is between the handle substrate and the epitaxial oxide layer, adjoining both. The oxide layer is directly bonded to the handle substrate in such embodiments. The compound semiconductor layer is formed from group III-V materials in some embodiments. In other embodiments, the compound semiconductor layer is a layer of group II-VI materials such as ZnSe.

A further structure provided in accordance with the disclosure includes a germanium base, one or more compound semiconductor layers adjoining the germanium base, the one or more compound semiconductor layers including a top layer of a desired compound semiconductor material, and an epitaxial oxide layer adjoining and lattice matched to the top layer. FIG. 27 shows an exemplary structure 150 including one compound semiconductor layer 158 that adjoins a germanium layer formed on a silicon substrate. In other embodiments, the germanium base is a germanium substrate such as the substrate 40 shown in FIGS. 1-7. The epitaxial oxide layer 160 adjoins and is lattice matched to the compound semiconductor layer 158, which is ZnSe in one or more exemplary embodiments. FIG. 28 provides a schematic illustration of an alternative embodiment of the further structure. In this embodiment, the structure 170 includes multiple compound semiconductor layers adjoining the germanium layer 156, the top layer 46 being a layer of the desired compound semiconductor material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
    growing a first epitaxial layer of a desired compound semiconductor material on a substrate;
    growing an epitaxial oxide layer on and lattice matched to the first epitaxial layer of the desired compound semiconductor material;
    forming a cleavage plane in the first epitaxial layer of the desired semiconductor material via implantation, thereby forming a first structure comprising the substrate, the first epitaxial layer of the desired compound semiconductor material having the cleavage plane, and the epitaxial oxide layer;
    bonding the first structure to a handle wafer;
    causing a fracture along the cleavage plane, thereby forming a second structure comprising the handle wafer, the epitaxial oxide layer, and a portion of the first epitaxial layer of desired compound semiconductor material;
    removing the portion of the first epitaxial layer of desired compound semiconductor material from the second structure subsequent to causing the fracture along the cleavage plane, thereby exposing a surface of the epitaxial oxide layer, and
    epitaxially growing a second epitaxial layer of substantially the same desired compound semiconductor material to which the epitaxial oxide layer was lattice matched on the exposed surface of the epitaxial oxide layer.

2. The method of claim 1, wherein the substrate is a silicon substrate having a germanium layer thereon.

3. The method of claim 2, wherein the first epitaxial layer of desired compound semiconductor material is grown directly on the germanium layer.

4. The method of claim 2, further including the step of growing a graded compound semiconductor layer on the germanium layer, the first epitaxial layer being grown on the graded compound semiconductor layer.

5. The method of claim 1, further including forming a silicon oxide layer on the epitaxial oxide layer and wherein the step of bonding the first structure to a handle wafer further includes bonding the silicon oxide layer to the handle wafer.

6. The method of claim 1, wherein the desired compound semiconductor material is a group III-V compound.

7. The method of claim 1, wherein the desired semiconductor material is a group II-VI compound.

8. A method comprising:
    growing a first epitaxial layer of a desired compound semiconductor material on a substrate;
    growing an epitaxial oxide layer on and lattice matched to the layer of the desired compound semiconductor material;
    forming a cleavage plane in the layer of the desired semiconductor material via implantation, thereby forming a first structure comprising the substrate, the layer of the desired compound semiconductor material having the cleavage plane, and the epitaxial oxide layer;
    bonding the first structure to a handle wafer;
    causing a fracture along the cleavage plane, thereby forming a second structure comprising the handle wafer, the epitaxial oxide layer, and a portion of the layer of desired compound semiconductor material;
    removing the portion of the layer of desired compound semiconductor material from the second structure;
    growing a second epitaxial layer of the desired compound semiconductor material on the epitaxial oxide layer;
    obtaining a third structure comprising the substrate, and a residual layer of the desired compound semiconductor material obtained from the fracture along the cleavage plane;
    planarizing a surface of the residual layer;
    growing a further layer of the desired compound semiconductor material on the planarized surface of the residual layer, and
    growing a further epitaxial oxide layer on the further layer of the desired compound semiconductor material.

9. The method of claim 1, wherein the substrate is a silicon substrate, further including the steps of growing a germanium layer on the substrate and growing the first epitaxial layer of the desired compound semiconductor material directly or indirectly on the germanium layer.

10. The method of claim 1, further including the step of forming an etch stop layer within the first epitaxial layer of the desired compound semiconductor material, the cleavage plane comprising hydrogen and being implanted above the etch stop layer.

11. The method of claim 8, wherein the desired compound semiconductor material is one of a group III-V compound and a group II-VI compound.

* * * * *